(12) United States Patent
Jin et al.

(10) Patent No.: US 7,138,316 B2
(45) Date of Patent: Nov. 21, 2006

(54) SEMICONDUCTOR CHANNEL ON INSULATOR STRUCTURE

(75) Inventors: Been-Yih Jin, Lake Oswego, OR (US);
Brian S. Doyle, Portland, OR (US);
Scott A. Hareland, Tigard, OR (US);
Mark L. Doczy, Beaverton, OR (US);
Matthew V. Metz, Hillsboro, OR (US);
Boyan I. Boyanov, Portland, OR (US);
Suman Datta, Beaverton, OR (US);
Jack T. Kavalieros, Portland, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 10/669,064

(22) Filed: Sep. 23, 2003

(65) Prior Publication Data

US 2005/0064616 A1   Mar. 24, 2005

(51) Int. Cl.
*H01L 21/336* (2006.01)
(52) U.S. Cl. .................. 438/269; 438/270; 438/272; 438/589
(58) Field of Classification Search ........... 438/268, 438/269, 270, 589, 272
See application file for complete search history.

(56) References Cited

U.S. PATENT DOCUMENTS

| | | | |
|---|---|---|---|
| 5,273,921 A | 12/1993 | Neudeck et al. | |
| 5,646,058 A | 7/1997 | Taur et al. | |
| 6,004,837 A | 12/1999 | Gambino | |
| 6,271,104 B1 | 8/2001 | Razeghi et al. | |
| 6,391,721 B1 * | 5/2002 | Nakagawa | 438/259 |
| 6,495,385 B1 | 12/2002 | Xie | |

FOREIGN PATENT DOCUMENTS

| | | |
|---|---|---|
| DE | 19928564 | 6/1999 |
| JP | 02087632 | 3/1990 |
| WO | WO 0079602 | 12/2000 |

\* cited by examiner

*Primary Examiner*—Hsien-Ming Lee
(74) *Attorney, Agent, or Firm*—Blakely, Sokoloff, Taylor & Zafman LLP

(57) ABSTRACT

A method including forming a via dielectric layer on a semiconductor device substrate; forming a trench dielectric layer on the via dielectric layer; forming a trench through the trench dielectric layer to expose the via dielectric layer; forming a via in the via dielectric layer through the trench to expose the substrate; and forming a semiconductor material in the via and in the trench. An apparatus including a device substrate; a dielectric layer formed on a surface of the device substrate; and a device base formed on the dielectric layer including a crystalline structure derived from the device substrate.

22 Claims, 5 Drawing Sheets

SEMICONDUCTOR CHANNEL ON INSULATOR STRUCTURE

BACKGROUND

1. Field

Device structures.

2. Background

Transistors and other devices are connected together to form circuits, such as very large scale integrated circuits, ultra-large scale integrated circuits, memory, and other types of circuits. When the size of transistors, for example, is reduced and device compaction is increased, problems may arise concerning parasitic capacitance, off-state leakage, power consumption, and other characteristics of a device. Semiconductor on insulator (SOI) structures have been proposed in an attempt to overcome some of these problems. However, SOI structures generally have a high rate of defects, as it is difficult to produce thin, uniform semiconductor layers in fabrication. Defect problems in SOI structures include defects within a single wafer (e.g., the thickness of a wafer differs at various points on the wafer) and defects from wafer to wafer (e.g., an inconsistent mean silicon layer thickness among SOI wafers). As transistor devices are made smaller, channel length is generally reduced. Reduction in the channel length generally results in an increased device speed, as gate delay typically decreases. However, a number of side effects may arise when channel length is reduced. Such negative side effects may include, among others, increased off-state leakage current due to threshold voltage roll-off (e.g., short channel effects).

One way of increasing device speed is to use higher carrier mobility semiconductor materials to form the channel. Carrier mobility is generally a measure of the velocity at which carriers flow in a semiconductor material under an external unit electric field. In a transistor device, carrier mobility is a measure of the velocity at which carriers (e.g., electrons and holes) flow through or across a device channel in an inversion layer. For example, higher carrier mobility has been found in narrow bandgap materials that include germanium (Ge). Germanium has electron and hole mobility of 3900 square centimeters per volt-seconds ($cm^2$/Vsec) and 1900 $cm^2$/Vsec, respectively, which are higher than that of electron and hole mobility of silicon, which are 1500 $cm^2$/Vsec and 450 $cm^2$/Vsec, respectively. The bandgap associated with a semiconductor material is generally based on the difference between the conduction band edge and valence band edge. Generally, higher mobility semiconductor materials have a narrower bandgap. With germanium, for example, the bandgap is approximately 0.67 electron-volts (eV), which is relatively small compared to that of silicon, which is approximately 1.1 eV.

For 300 millimeters (mm) wafers, it is difficult to grow a single crystal of high carrier mobility material. One way to use higher carrier mobility semiconductor materials in 300 mm or larger wafer size device fabrication is to grow the material epitaxially on a 300 mm or larger silicon carrier wafer. However, there is generally a large lattice mismatch between the high carrier mobility material and silicon. This large lattice mismatch tends to results in a high level of defects in the as grown epitaxial high mobility layer. One technique to reduce the defect density in the epitaxial layer is to introduce a graded buffer layer between the silicon carrier and the high carrier mobility material. By utilizing a graded buffer layer, the lattice parameter is varied in the buffer layer to serve as a transition between, for example, the silicon carrier to the higher carrier mobility epitaxial layer in a gradual fashion from the silicon material with a small or lower lattice mismatch being at the silicon interface and throughout the buffer layer. However, even though this graded buffer layer will tend to reduce some of the defects due to lattice mismatch, it is generally not sufficient to produce acceptable quality epitaxial layers for device applications.

BRIEF DESCRIPTION OF THE DRAWINGS

Features, aspects, and advantages of embodiments will become more thoroughly apparent from the following detailed description, appended claims, and accompanying drawings in which:

DETAILED DESCRIPTION

Figure 1:
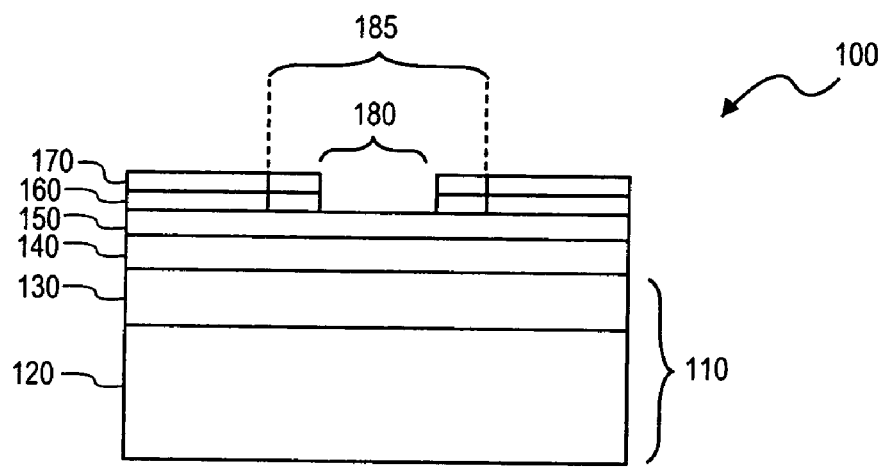
FIG. 1 shows a cross-sectional side view of a portion of a structure including a semiconductor substrate having multiple dielectric layers formed thereon and a trench formed in ones of the dielectric layers.

FIG. 1 shows a cross-sectional side view of a portion of a device structure. Device structure 100, in this embodiment, includes substrate 110. Substrate 110 includes a single crystal silicon substrate, such as portion 120 of 300 mm or larger single crystal silicon wafer. On portion 120 is graded epitaxial layer 130. In one embodiment, graded epitaxial layer is a high carrier mobility material such as silicon germanium (SiGe), gallium arsenide (GaAs), or indium antimony (InSb). In terms of a graded layer on portion 120 of silicon, epitaxial layer 130 has a relatively low lattice-mismatch film (e.g., a lattice mismatch less than one percent) nearest the portion 120 and the lattice mismatch generally increases in epitaxial layer 130 moving away from portion 120.

In the structure shown in FIG. 1, overlying substrate 110 (on epitaxial layer 130) is first dielectric layer 140. In one embodiment, first dielectric layer 140 is an oxide (e.g., silicon dioxide ($SiO_2$)). First dielectric layer 140 is deposited to a thickness, as will become more clear later, that defects (e.g., dislocations) resulting from epitaxial layer 130 will terminate with first dielectric layer 140. Representatively, a layer of $SiO_2$ can be deposited by chemical vapor deposition (CVD) or atomic layer deposition (ALD). Overlying first dielectric layer 140 in the structure of FIG. 1 is second dielectric layer 150. In one embodiment, second-dielectric layer 150 has an etch characteristic such that it may be etched (e.g., removed) selectively in the presence of first dielectric layer 140. In one embodiment, second dielectric layer 150 is silicon nitride ($Si_3N_4$) deposited, for example, by CVD or ALD.

Overlying second dielectric layer 150 in the structure shown in FIG. 1 is third dielectric layer 160. In one embodiment, third dielectric layer 160 is a material that may be selectively etched (e.g., removed) in the presence of second dielectric layer 150. In one embodiment, third dielectric layer 160 is an oxide (e.g., $SiO_2$) deposited by CVD or ALD. As will be come more clear later, third dielectric layer 160 is deposited, in one embodiment, to a thickness at least suitable as a thickness for a device channel (e.g., a transistor device channel). Third dielectric layer 160 of $SiO_2$ may be deposited, in one embodiment, by ALD to a thickness less than 100 angstroms (Å).

Overlying third dielectric layer 160 in the embodiment of a structure shown in FIG. 1 is fourth dielectric layer 170. In one embodiment fourth dielectric layer 170 has an etch characteristic such that it may be selectively etched (e.g., removed) in the presence of third dielectric layer 160. In one embodiment, fourth dielectric layer 170 is a silicon nitride ($Si_3N_4$) material deposited, for example, by CVD or ALD.

In the embodiment of the structure shown in FIG. 1, trench 180 with trench pad 185 is formed in and/or through third dielectric layer 160 and fourth dielectric layer 170. In one embodiment, trench 180 and trench pad 185 may be formed using photolithographic techniques. For example, a masking material may define an exposed region or area of fourth dielectric layer 170 for trench 180 and trench pad 185. Suitably, trench 180 has a dimension suitable for at least a device channel (e.g., a transistor device channel) including a length, $L_1$, and width, $W_1$. Representatively, photolithographic techniques may be used to define a mask having an opening area suitable for forming a device channel (nanometer scale dimension). In one embodiment, trench pad 185 is selected to have an area ($L_2 \times W_2$) sufficient to provide area for the formation of a via in an area (base) of trench pad 185 (i.e., through second dielectric layer 150 and first dielectric layer 140). In one embodiment, a feature size of trench 180 is selected to be minimized (e.g., feature size defined by width, $W_1$), so trench pad 185 has a width, $W_2$, greater than width, $W_1$ of trench 180. Trench pad 185 has, in this embodiment, a length, $L_2$, sufficient to provide area for a subsequent via.

Figure 2:
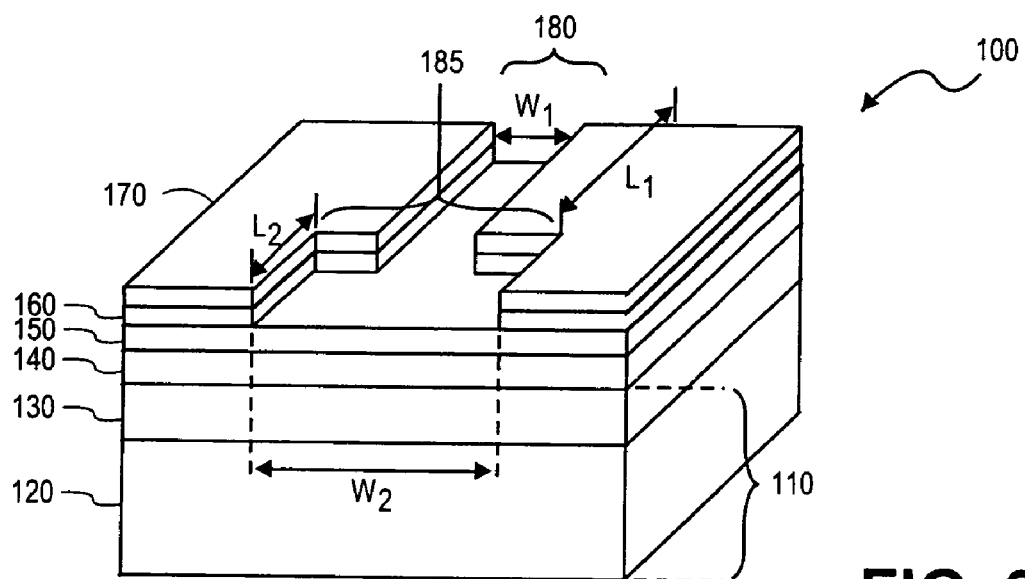
FIG. 2 shows a top perspective view of the structure of FIG. 1.

To form trench 180 and trench pad 185, an etch chemistry suitable for etching silicon nitride (e.g., a $CF_4/O_2$ chemistry) may then be used to expose third dielectric layer 160. Following the removal of the channel region corresponding to fourth dielectric layer 170, an etch chemistry suitable for etching third dielectric layer 160 may be employed to further define trench 180 and trench pad 185 through third dielectric layer 160. A suitable chemistry for etching $SiO_2$ to the exclusion of $Si_3N_4$ (e.g., to stop on a second dielectric layer 150 of, for example, $Si_3N_4$) is, for example, $CHF_3/O_2$. FIG. 2 shows a top perspective view of structure 100 showing trench 180 and trench pad 185 formed through fourth dielectric layer 170 and third dielectric layer 160. Following the formation of trench 180 and trench pad 185, any photolithographic mask used to define trench 180 and trench pad 185 may be removed.

Figure 3:
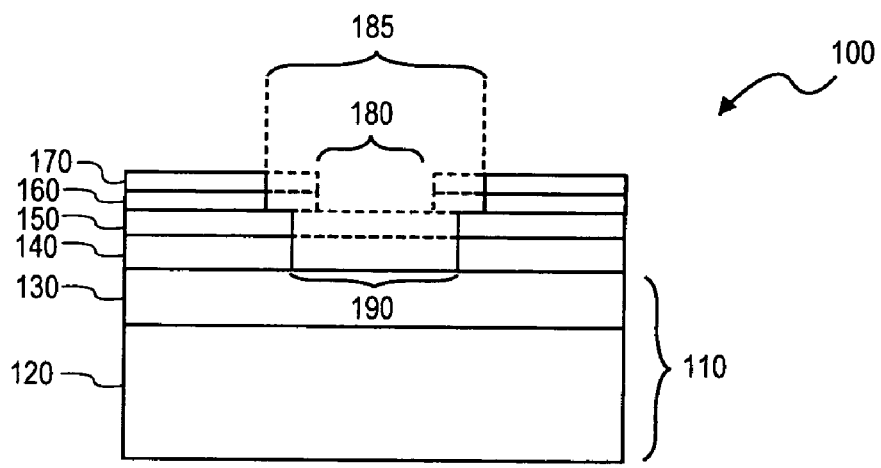
FIG. 3 shows the structure of FIG. 1 with a via formed in others of the dielectric layers through the trench.
Figure 4:
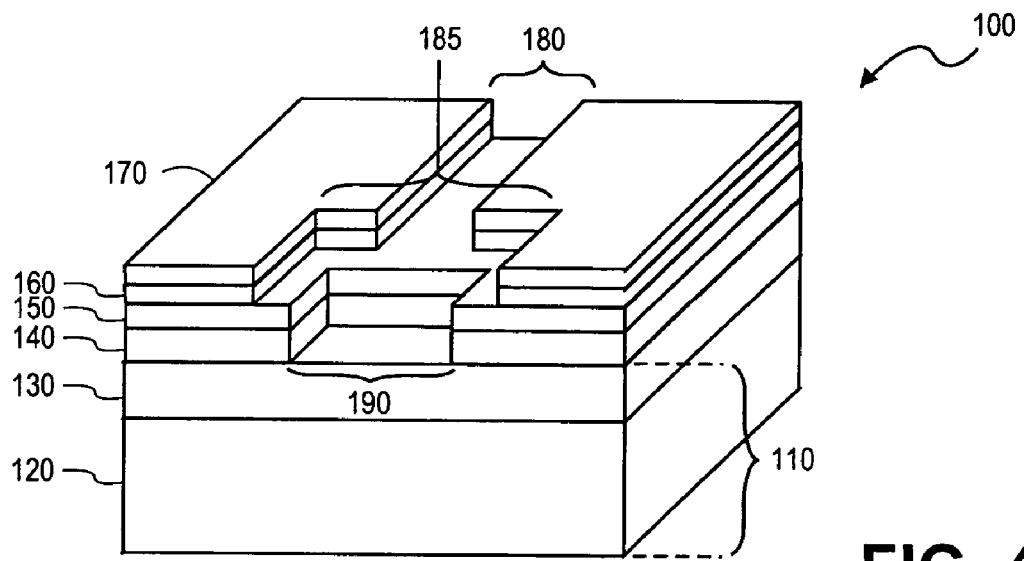
FIG. 4 shows a top perspective view of the structure of FIG. 3.

FIG. 3 shows the structure of FIG. 1 following the formation of a via in trench 180 and trench pad 185. In one embodiment, via 190 may be formed by defining an opening through an exposed portion of second dielectric layer 150 (exposed in trench pad 185) through photolithographic techniques. An etch chemistry suitable for etching second dielectric layer 150 may then be utilized to remove a portion of second dielectric layer 150 corresponding to the via opening and expose first dielectric layer 140. Via 190 may be defined of a dimension suitable for crystal growth. An etch chemistry suitable for etching first dielectric layer 140 may then be used to further define via 190. An etch chemistry, in one embodiment, suitable for etching first dielectric layer 140 of $SiO_2$ selectively relative to epitaxial layer 130 is, for example, $CHF_3/O_2$. Accordingly, via 190 is formed in an area defined by trench pad 185 through second dielectric layer 150 and first dielectric layer 140 and stops (terminates) at epitaxial layer 130. FIG. 4 shows a top perspective view of the structure of FIG. 3 showing via 190 formed trench pad 185 to epitaxial layer 130.

Figure 5:
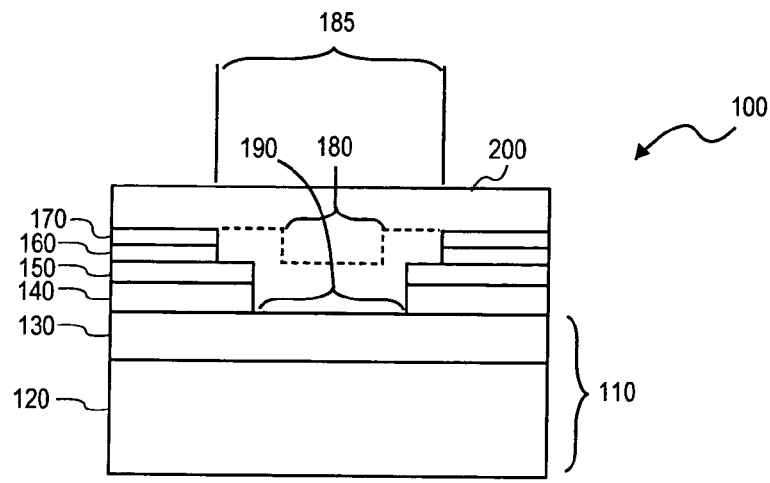
FIG. 5 shows the structure of FIG. 3 with a semiconductor material formed in the trench and via.

FIG. 5 shows structure 100 following the introduction of a semiconductor material in trench 180, trench pad 185 and via 190. FIG. 5 shows the structure of FIG. 3 following the introduction of semiconductor material into trench 180, trench pad 185 and via 190. In one embodiment, semiconductor material 200 is deposited as an amorphous, polycrystalline, or epitaxial layer of semiconductor material. Suitable semiconductor material includes silicon, or a high carrier mobility material such as SiGe, GaAs, or InSb material. Semiconductor material 200 may be deposited by chemical vapor deposition or other techniques. As shown in FIG. 5, in one embodiment, semiconductor material 200 is deposited to a thickness such that the material fills via 190 and trench 180 and overlies (as viewed) fourth dielectric layer 170.

In an embodiment where semiconductor material 200 is amorphous or polycrystalline when deposited, semiconductor material 200 is annealed such that a crystalline seed from epitaxial layer 130 grows through semiconductor material 200. In one embodiment, annealing conditions are selected such that crystalline growth begins in via 190 and spreads beyond via 190 into trench pad 185 and trench 180. Thus, epitaxial growth is progressive in that the growth occurs in via 190 initially then spreads through trench pad 185 and trench 180 and laterally grows within trench pad 185 and trench 180 and ultimately above trench 180. Thus, an amorphous or polycrystalline material may be converted to single crystalline with a suitable anneal. For example, when a silicon material is used for semiconductor material 200, it can be amorphous or polycrystalline when deposited on the dielectric surface. Here, the amorphous to polycrystalline transition occurs between a deposition temperature of 580° C. to 590° C. Silicon is grown epitaxially directly on exposed Si area resulting in a single crystalline material with varied defect density. An anneal of silicon material at a temperature of 1000° C. or greater will tend to crystallize the amorphous or polycrystalline Si into single crystalline material within via 190 and trench pad 185 and trench 180, as well as tend to reduce the as grown defect density.

In another embodiment, rather than depositing semiconductor material 200 as an amorphous or polycrystalline material, semiconductor material may be selectively deposited (e.g., by CVD or molecular beam epitaxy (MBE) techniques) at a single crystalline growth temperature (e.g., 800° C. or greater for silicon) and grown, starting from via 190 with continued growth into trench pad 185 and trench 180. Following the growth, an optional final anneal at a higher temperature may be employed to reduce the defect density. The higher temperature anneal may be accomplished by rapid thermal, spike anneal, or by a laser anneal to minimize the atomic interdiffusion to retain the chemical composition in the high mobility channel and the epitaxial buffer layer regions.

Figure 6:
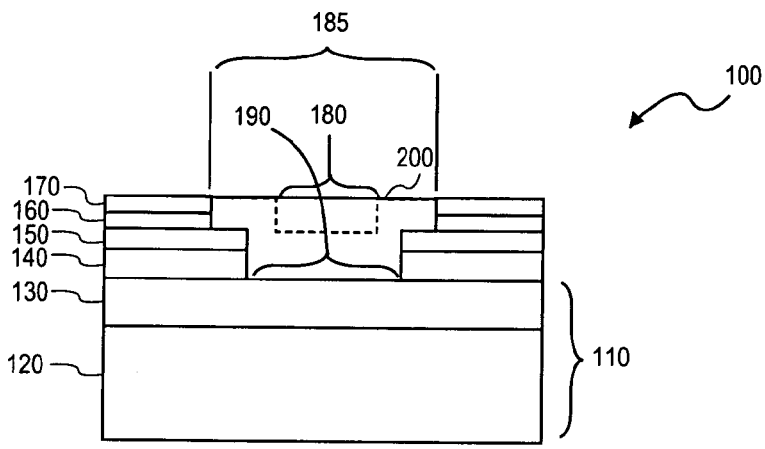
FIG. 6 shows the structure of FIG. 5 after a planarization to restrict the semiconductor material to the trench and via.

Following the deposition and optional anneal of semiconductor material 200, structure 100 is planarized to confine semiconductor material 200 to trench pad 185, trench 180 and via 190. FIG. 6 shows structure 100 following the planarization of the structure to restrict semiconductor material 200 to trench pad 185, trench 180 and via 190. In one embodiment, a polish, such as a chemical-mechanical polish may be used to planarize structure 100. In one embodiment, semiconductor material 200 in trench 180 is planarized to a thickness such that it may be suitable as a device channel for a device ultimately formed in/on semiconductor material 200. Following the planarization, a surface cleaning is done with a optional anneal to create a high quality semiconductor surface in trench 180 for device fabrication.

Figure 7:
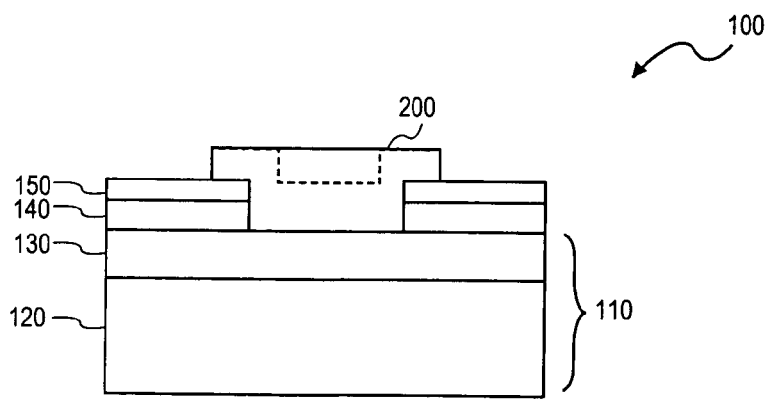
FIG. 7 shows the structure of FIG. 6 following the removal of ones of the dielectric layers to expose the semiconductor material of the trench.
Figure 8:
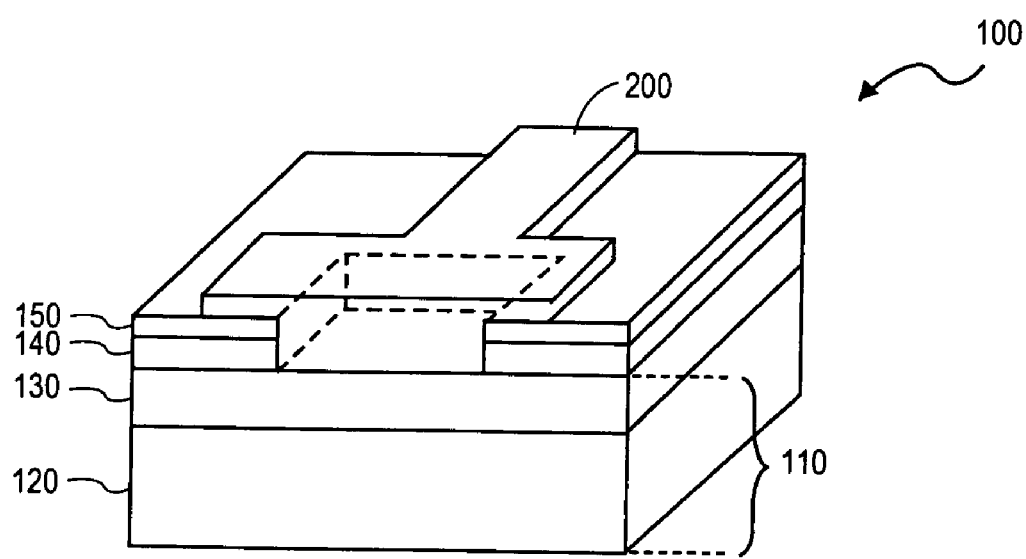
FIG. 8 shows a top perspective view of the structure of FIG. 7.

FIG. 7 shows structure of FIG. 6 following the removal of fourth dielectric layer 170 and third dielectric layer 160. Fourth dielectric layer 170 may be removed by etch techniques, for example, utilizing an etchant suitable for removing fourth dielectric layer 170 (e.g., $Si_3N_4$) to the exclusion of semiconductor material 200 (e.g., phosphorus acid for $Si_3N_4$). Following the removal of fourth dielectric layer 170, third dielectric layer 160 may be removed, again using an etch chemistry suitable for removing third dielectric layer 160 to the exclusion of semiconductor material 200 (e.g., a hydrogen flouride chemistry for $SiO_2$). FIG. 7 shows the structure including semiconductor material 200, the trench portion of semiconductor material 200, exposed on a surface of structure 100 (a top surface as viewed). FIG. 8 shows a top, perspective view of the structure of FIG. 7 and shows semiconductor material 200 formed in what was trench 180, trench pad 185 and via 190 of previously illustrated structure 100 (see FIG. 3 and FIG. 4).

Figure 9:
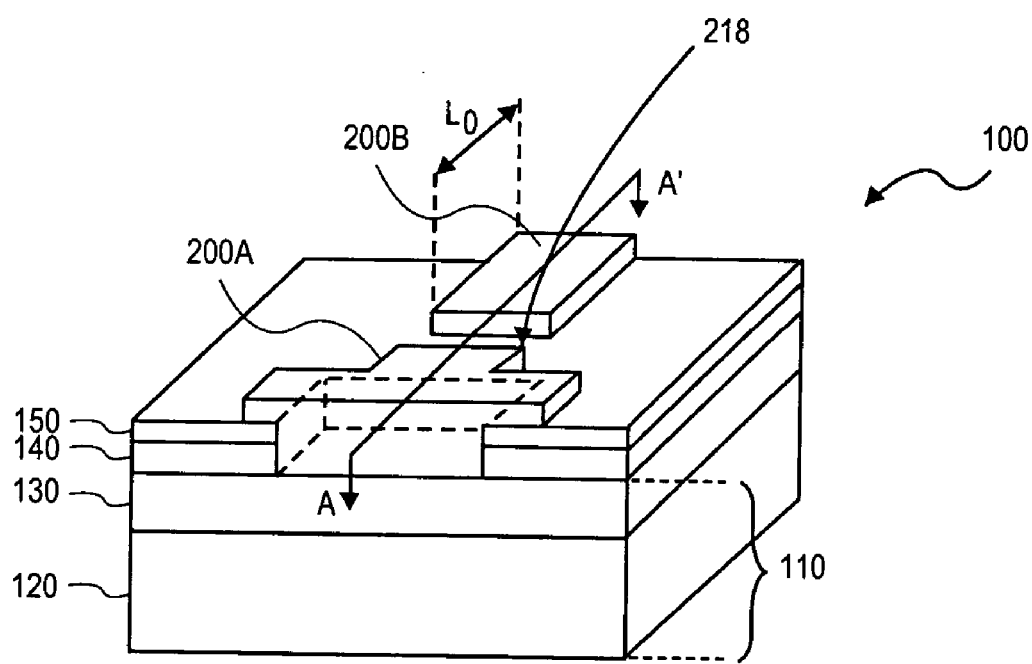
FIG. 9 shows the structure of FIG. 8 following the separation of a portion of the trench material from the via material.

FIG. 9 shows the structure of FIG. 8 following the separation of a portion of semiconductor material 200 from the portion that includes semiconductor material 200 within via 190 and a portion of trench pad 185 including, but not limited to, the entire portion. Referring to FIG. 9, structure 100 includes semiconductor material 200 defined as semiconductor portion 200A and semiconductor portion 200B. Semiconductor portion 200B is separated at reference numeral 218 from semiconductor portion 200A which includes semiconductor material in via 190. Photolithographic/etch techniques may be used to separate semiconductor portion 200A and semiconductor portion 200B. In this manner, semiconductor portion 200B may be used as a channel for device formation and semiconductor portion 200A isolated. One reason to separate a portion of the semiconductor material that includes the portion extending through the via is that that portion containing epitaxial layer 130 is electrically disconnected from semiconductor portion 200B. Thus, where the first dielectric layer 140 is a dielectric material such as $SiO_2$, that portion of structure 100 including semiconductor portion 200B is a semiconductor on insulated (SOI) structure, with semiconductor portion 200B serving as a device channel. Semiconductor portion 200B has a length, $L_0$, that, in one embodiment, is less than $L_1$.

Figure 10:
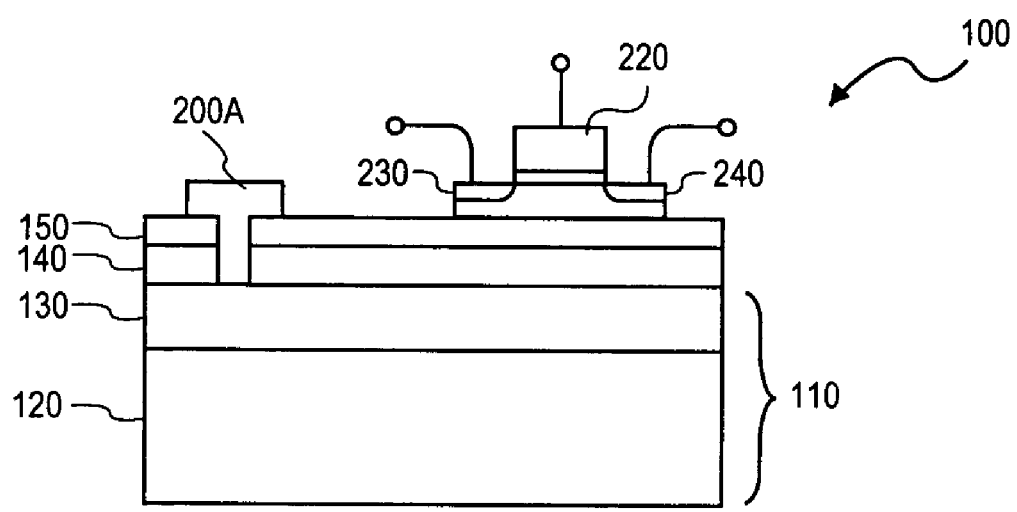
FIG. 10 shows a cross-sectional side view through line A–A' of FIG. 9.

FIG. 10 shows the structure of FIG. 9 through a cross-section through lines A–A' of FIG. 9. In this representative embodiment, a transistor device is formed in/on semiconductor portion 200B. Representatively, the transistor device includes gate electrode 220 on semiconductor portion 200B (separated by a dielectric material) and source junction 230 and drain junction 240 formed in semiconductor portion 200B.

In the above embodiments, various dielectric layers have been described in forming an SOI structure. It is appreciated that the designation of first through fourth dielectric layers are for convenience and should not be understood to limit the subject matter described in the claims. Thus, for example, although four dielectric layers are described, it is appreciated that one or more may be combined into a single or multiple dielectric layers. Alternatively, more than four dielectric layers may be used to define a structure. It is appreciated that the various layers formed on structure 100 to define a device channel need not each be (or all be) dielectric material layers. Although an SOI structure is formed (requiring, for example, second dielectric layer 150 and perhaps first dielectric layer 140), for similar or other structures the various layers (particularly third dielectric layer 160 and fourth dielectric layer 170) may be formed of other suitable materials since the layers may be sacrificial in the sense that they may be removed to form an ultimate device structure. The embodiments described take advantage of the deposit and etch techniques of dielectric materials such as $SiO_2$ and $Si_3N_4$. Such techniques allow the fabrication of small critical dimension (CD) structures such as channel structures and the control of the channel thickness (through trench depth). Further, the defect density associated with semiconductor materials having different lattice structures may be controlled again by the thickness of dielectric layer material (via depth).

In the preceding paragraphs, specific embodiments are described. It will, however, be evident that various modifications and changes may be made thereto without departing from the broader spirit and scope of the claims. The specification and drawings are, accordingly, to be regarded in an illustrative rather than a restrictive sense.

What is claimed is:

1. A method comprising:
   forming a via layer comprising a dielectric material on a semiconductor device substrate;
   forming a trench layer on the via layer;
   forming a trench through the trench layer to expose the via layer;
   forming a via in the via layer in the trench to expose the substrate;
   forming a semiconductor material in the via and in the trench; and
   crystallizing the semiconductor material in the trench.

2. The method of claim 1, wherein forming a via layer comprises:
   forming a primary dielectric layer comprising a material having a first etch characteristic; and
   forming a secondary dielectric layer on the primary dielectric layer, the secondary dielectric layer comprising a material having a second etch characteristic different from the first etch characteristic.

3. The method of claim 2, wherein the primary dielectric layer comprises silicon dioxide and the secondary dielectric layer comprises silicon nitride.

4. The method of claim 2, wherein the substrate comprises a first semiconductor material and a second semiconductor material on a portion of the first semiconductor material, the second semiconductor material having a different lattice parameter than the first semiconductor material and forming a via layer comprises forming a via layer to a thickness to minimize a crystalline defect in the second semiconductor material from propagating beyond a depth of the via.

5. The method of claim 1, further comprising:
   planarizing an exposed surface of the semiconductor material in the trench.

6. The method of claim 5, wherein planarizing comprises planarizing of the semiconductor material in the trench to a thickness suitable as a device channel.

7. The method of claim 1, further comprising electrically isolating a portion of the semiconductor material formed in the trench from a portion of the semiconductor material formed in the via.

8. The method of claim 7, wherein the isolated portion of the semiconductor material formed in the trench has a dimension suitable as a circuit device base.

9. The method of claim 1, wherein forming a trench layer comprises:
   forming a primary dielectric layer comprising a material having a first etch characteristic different than a portion of the via layer; and
   forming a secondary dielectric layer comprising a material having a second etch characteristic different than the primary dielectric layer.

10. The method of claim 9, wherein forming the primary dielectric layer comprises forming a layer to a thickness selected to be suitable as a circuit device base.

11. The method of claim 1, further comprising removing the trench layer after forming a semiconductor material in the trench.

12. The method of claim 1, wherein crystallizing comprises annealing the semiconductor material at a temperature suitable to produce a single crystal mass.

13. The method of claim 1, wherein forming a trench layer comprises:
   forming a trench of a length at least suitable for a device channel; and
   forming a trench pad having dimensions different than the trench adjacent to the trench,
   wherein forming a via comprises forming a via in a portion of the trench pad.

14. A method comprising:
   forming a first dielectric layer on a device substrate;
   forming a second dielectric layer on the first dielectric layer, the second dielectric layer comprising a material having an etch characteristic different than a material of the first dielectric layer;
   forming a third dielectric layer on the second dielectric layer, the third dielectric layer comprising a material having an etch characteristic different than the material of the second dielectric layer;
   forming a fourth dielectric layer on the third dielectric layer, the fourth dielectric layer comprising a material having an etch characteristic different than a material of the third-dielectric layer;
   forming a trench through the third dielectric layer;
   forming a via in the trench to expose the substrate;
   forming a semiconductor material in the via and in the trench; and crystallizing the semiconductor material in the trench.

15. The method of claim 14, further comprising:
   planarizing an exposed surface of the semiconductor material in the trench.

16. The method of claim 15, wherein planarizing comprises planarizing of the semiconductor material in the trench to a thickness suitable as a device channel.

17. The method of claim 14, further comprising removing the third dielectric layer and the fourth dielectric layer after forming a semiconductor material in the trench.

18. The method of claim 17, further comprising electrically isolating a portion of the semiconductor material formed in the trench from a portion of the semiconductor material formed in the via.

19. The method of claim 18, wherein the isolated portion of the semiconductor material formed in the trench has a dimension suitable as a circuit device base.

20. The method of claim 14, wherein each of the dielectric layers comprises a dielectric material, the first dielectric layer and the third dielectric layer comprise similar materials, and the second dielectric layer and the fourth dielectric layer comprise similar materials.

21. The method of claim 14, wherein the substrate comprises a first semiconductor material and a second semiconductor material on the first semiconductor material, the second semiconductor material having a different lattice structure than the first semiconductor material and forming a first dielectric layer comprises forming a first dielectric layer to a thickness to minimize a crystalline defect in the second semiconductor material from propagating beyond a depth of the via.

22. The method of claim 14, wherein forming a trench layer comprises:
   forming a trench of a length at least suitable for a device channel; and
   forming a trench pad having a dimension different than the trench adjacent to the trench,
   wherein forming a via comprises forming a via in a portion of the trench pad.

* * * * *